United States Patent
Kang et al.

(10) Patent No.: US 7,042,045 B2
(45) Date of Patent: May 9, 2006

(54) NON-VOLATILE MEMORY CELL HAVING A SILICON-OXIDE NITRIDE-OXIDE-SILICON GATE STRUCTURE

(75) Inventors: Sung-Taeg Kang, Seoul (KR); Seung-Gyun Kim, Gyengki-do (KR); Jung-Wook Han, Gyengki-do (KR); Hyun-Khe Yoo, Gyengki-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/164,943

(22) Filed: Jun. 4, 2002

(65) Prior Publication Data

US 2003/0224564 A1     Dec. 4, 2003

(51) Int. Cl.
*H01L 29/788*    (2006.01)

(52) U.S. Cl. .................. 257/321; 257/315; 257/314

(58) Field of Classification Search ............... 257/314, 257/315, 316, 321
See application file for complete search history.

(56) References Cited

U.S. PATENT DOCUMENTS

| | | | |
|---|---|---|---|
| 5,168,334 A | 12/1992 | Mitchell et al. | |
| 5,338,954 A | 8/1994 | Shimoji | |
| 5,467,308 A | 11/1995 | Chang et al. | |
| 5,589,700 A * | 12/1996 | Nakao | 257/325 |
| 5,703,388 A | 12/1997 | Wang et al. | |
| 5,768,192 A | 6/1998 | Eitan | |
| 5,821,581 A | 10/1998 | Kaya et al. | |
| 5,877,523 A | 3/1999 | Liang et al. | |
| 5,923,978 A | 7/1999 | Hisamune | |
| 6,011,725 A | 1/2000 | Eitan | |
| 6,040,216 A * | 3/2000 | Sung | 438/257 |
| 6,103,572 A | 8/2000 | Kirihara | |
| 6,160,739 A * | 12/2000 | Wong | 365/185.29 |
| 6,181,597 B1 | 1/2001 | Nachumovsky | |
| 6,190,966 B1 | 2/2001 | Ngo et al. | |
| 6,269,023 B1 | 7/2001 | Derchacobian et al. | |
| 6,399,441 B1 * | 6/2002 | Ogura et al. | 438/257 |
| 6,642,573 B1 * | 11/2003 | Halliyal et al. | 257/316 |
| 2002/0076850 A1 * | 6/2002 | Sadd et al. | 438/90 |
| 2003/0223288 A1 * | 12/2003 | Choi | 365/200 |

FOREIGN PATENT DOCUMENTS

DE    10036911 A1    7/2000

* cited by examiner

*Primary Examiner*—Bradley K. Smith
(74) *Attorney, Agent, or Firm*—Marger Johnson & McCollom, P.C.

(57) ABSTRACT

A non-volatile memory cell able to be written in a first direction and read in a second direction is described. The memory cell includes one or two charge trapping regions located near either the source or the drain, or both the source and the drain. During a programming operation, electrons can be injected into the charge trapping region by hot electron injection. During an erasing operation, holes can be injected into the charge trapping region. Embodiments of the invention include a charge trapping region that is overlapped by the control gate only to an extent where the electrons that were injected during a programming operation can be erased later by injecting holes in the charge trapping region.

41 Claims, 10 Drawing Sheets

FIG. 7-A

|  | D1 | D2 | SL | CG0 | CG1 | CG2 |
|---|---|---|---|---|---|---|
| Program | 0V | 6.5V | 0V | 0V | 9V | 0V |
| Erase | Open | 6.5V | Open | 6.5V | -9V | 6.5V |
| Read | 1V | 0V | 1V | 0V | 3V | 0V |

FIG. 7-B

NON-VOLATILE MEMORY CELL HAVING A SILICON-OXIDE NITRIDE-OXIDE-SILICON GATE STRUCTURE

TECHNICAL FIELD

This disclosure relates to non-volatile memory cells, and, more particularly, to memory cells having Silicon-Oxide-Nitride-Oxide-Silicon gate structures.

BACKGROUND OF THE INVENTION

Semiconductor memory devices that are used for storing data can generally be categorized as being either volatile or non-volatile memory devices. Volatile memory devices lose their stored data when their power supplies are interrupted, while nonvolatile memory devices retain their stored data even when their power supplies are interrupted. Thus, non-volatile memory devices are widely used in situations where power is not always available, is frequently interrupted, or when low power usage is required, such as in mobile telecommunication systems, memory cards for storing music and/or image data, and in other applications.

Generally, cell transistors in non-volatile memory devices have a stacked gate structure. The stacked gate structure includes, sequentially stacked on a channel region of the cell transistor, a gate insulating layer, a floating gate, an inter-gate dielectric layer and a control gate electrode. Viewed in cross section of FIG. 2, some types of non-volatile memory devices have layers of Silicon (in which the channel region is formed), Oxide (which forms the tunneling layer), Nitride (used for the charge trapping layer), Oxide (used for the blocking layer), and Silicon (used for the control gate electrode). Sometimes these layers are collectively referred to as SONOS.

FIGS. 1–4 show the conventional structure of a semiconductor nonvolatile memory device having the SONOS structure that is able to be programmed by hot electron injection. The conventional method of fabricating it will be explained with reference to those figures.

As shown in FIG. 1, a silicon oxide layer for providing a tunneling layer 1 is formed over the entire surface of a semiconductor substrate 6. Next, a silicon nitride layer for providing a charge trapping layer 2 is formed over the whole surface of the tunneling layer 1 by, for example, a chemical vapor deposition (CVD) process. This silicon nitride layer is subjected to a thermal oxidation to form a silicon oxide layer for providing a blocking layer 3. Of course, other methods of forming the blocking layer 3 are known, and can be used instead of or in conjunction with thermal oxidation.

After this, a polycrystalline silicon layer for providing a control gate electrode 4 is formed over the whole surface of the blocking layer 3 by, e.g., a chemical vapor deposition process. The preceding processes make a structure as shown in FIG. 1.

A patterned photoresist (not shown) is then formed on the polycrystalline silicon layer. The patterned photoresist is used as an etching mask to sequentially etch the polycrystalline silicon layer, the blocking layer 3, the charge trapping layer 2 and the tunneling layer 1 in order to create therefrom a memory cell 5 including a polysilicon control gate electrode 14, a blocking layer 13, a charge trapping layer 12 and a tunneling layer 8, as shown in FIG. 2. The photoresist that was used as the etching mask is thereafter removed.

The tunneling layer 8 is a dielectric layer through which charge carriers (holes or electrons) can be injected. The charge trapping layer 12 is a dielectric layer whose function is to trap electrons or holes that were injected through the tunneling layer 8. The function of the blocking layer 13 is to block injected electrons or holes from traveling through to the control gate electrode 14, during writing and erasing operations of the memory cell.

Next, high-concentration diffused regions 15, 17 are formed by implanting a first conductivity type ions into the region of the semiconductor substrate 6 at prescribed portions thereof, self-aligned with opposite sides of the polysilicon control gate 14. The high-concentration diffused regions 15, 17 operate as the source or drain of the memory cell 5, as described below.

The operation of the conventional semiconductor non-volatile memory device 5 having the SONOS structure will be explained with reference to FIGS. 3 and 4.

When the control gate 14 is positively charged and the diffused regions 15, 17 are properly biased, hot electrons from the semiconductor substrate 6 are trapped into a charge trapping region 7 of the charge trapping layer 12. This is known as writing to or "programming" the memory cell 5. As can be seen in FIG. 3, the trapping region 7 has a length "A".

Similarly, when the control gate 14 is negatively charged, and the diffused regions 15, 17 are properly biased, holes from the semiconductor substrate 6 can also be trapped in the trapping region 7, combining with any extra electrons that are already in the trapping region. This is known as "erasing" the programmed memory cell 5.

Specifically, the electrons or holes trapped in the trapping region 7 can change the threshold voltage of the semiconductor nonvolatile memory device 5. Typically, programming stops when a threshold voltage of the memory device 5 has reached a certain predetermined point (i.e., when the channel current is reduced to a sufficiently low level). This point is chosen to ensure that a '0' bit stored in the memory device can be distinguished from a '1' bit, and that a certain data retention time has been achieved.

Erasing typically stops when the threshold voltage has reached its former condition (i.e., when enough holes are trapped in the trapping region 7 to recombine with the previously trapped electrons). However, when an excessive amount of electrons are trapped in the trapping region 7 of the charge trapping layer 12, or not enough holes can be injected into the trapping region to bring the memory cell to its former condition, then the threshold voltage of the memory cell 5 cannot be completely erased, i.e., cannot reach the necessary prescribed condition. The memory cell 5 in this state is useless, because it can never be erased.

FIG. 4 shows a sub-portion B of the trapping region 7, along with the sub-portion A. The length labeled A in FIGS. 3 and 4 indicates the area in the trapping region 7 where the electrons are trapped in the charge trapping layer 12, while a length labeled B indicates the portion of the trapping region 7 that traps the holes.

The difference in length of measurements A and B in FIG. 4 may explain the above condition where too many electrons or not enough holes are trapped in the region 7, preventing the memory cell 5 from being completely erased, and thus rendered useless. The fact that electrons are trapped in an area far away from the highly doped area 17 (functioning as the drain or source) may adversely affect the erase operation. In some cases, the memory device 5 cannot be completely erased because the trapping region 7 is programmed too wide. Thus, storing too many electrons or holes in the trapping region 7 and the stored carriers' location relative to the diffused regions 15, 17 can cause errors during operation of the nonvolatile memory device 5.

Embodiments of the invention address these and other deficiencies in the prior art.

BRIEF DESCRIPTION OF THE DRAWINGS

The description of the present invention may be best understood by reading the disclosure with reference to the accompanying drawings.

DETAILED DESCRIPTION OF THE PREFERRED EMBODIMENTS

Figure 1:
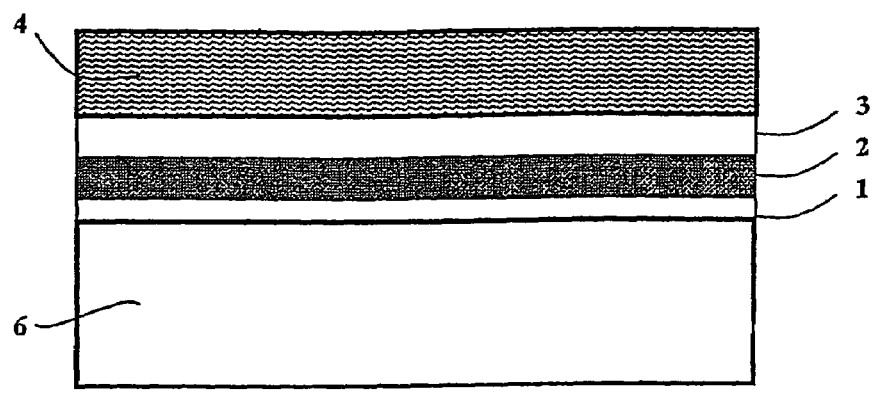
FIG. 1 is a cross-sectional view of a substrate having SONOS layers formed thereon.
Figure 2:
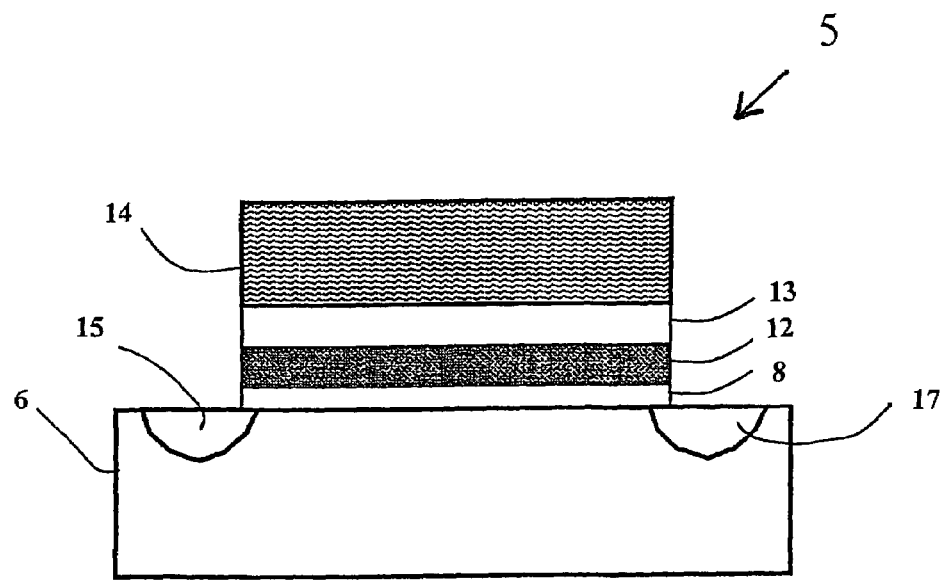
FIG. 2 is a cross-sectional view of the substrate of FIG. 1 after it has been patterned to form a non-volatile memory device.
Figure 3:
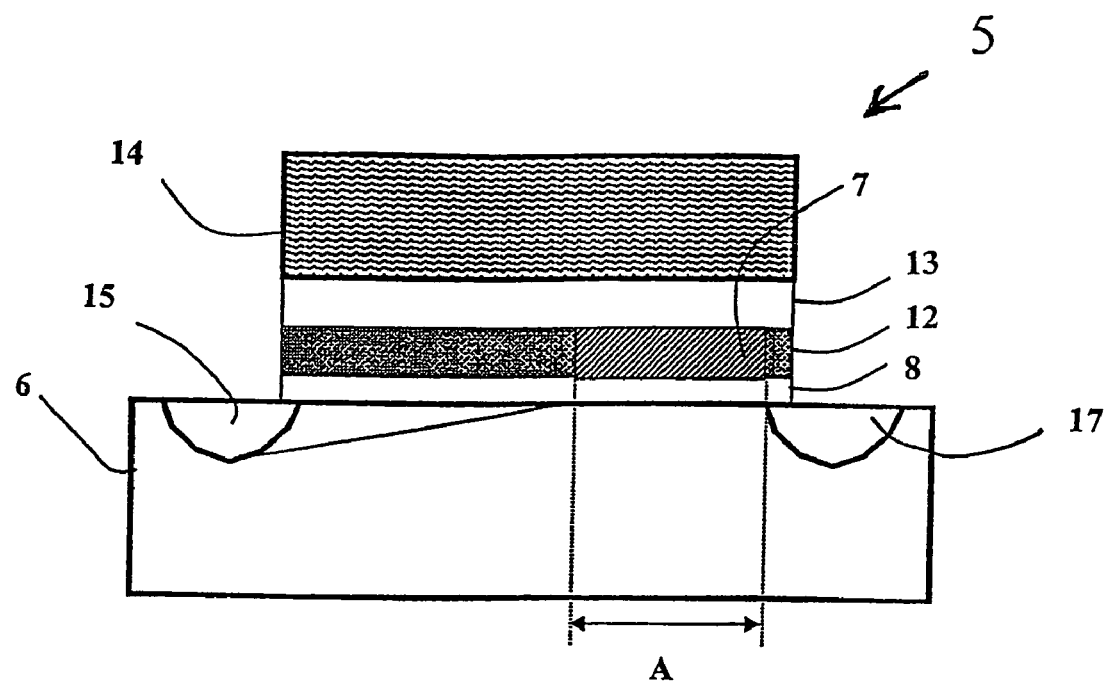
FIGS. 3 and 4 are cross-sectional views illustrating programming and erasing operations of the memory device shown in FIG. 2.
Figure 4:
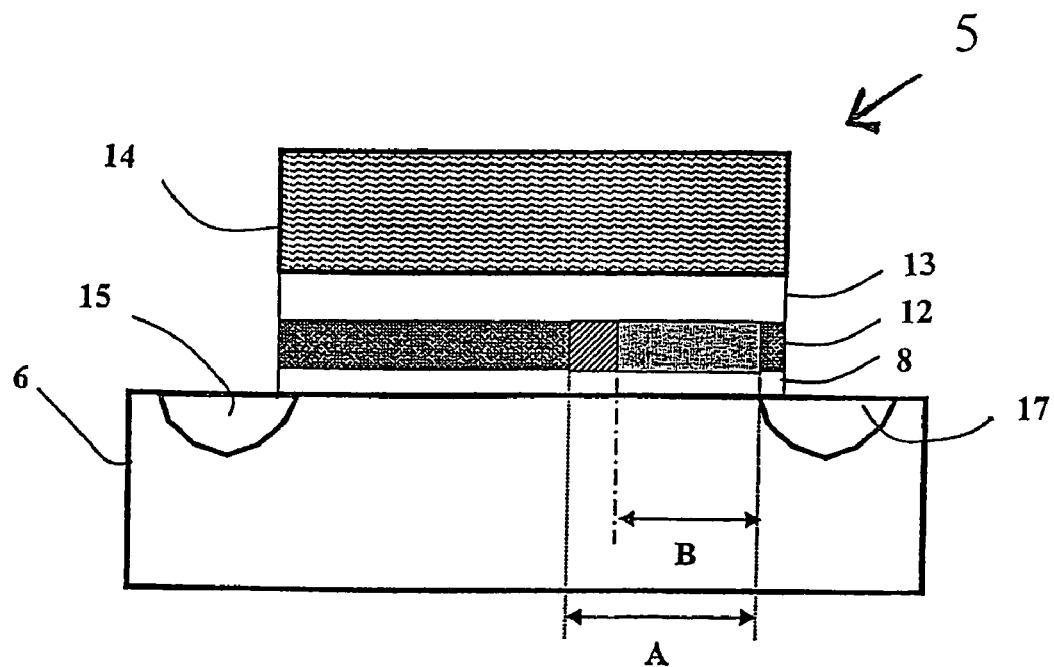
Figure 5:
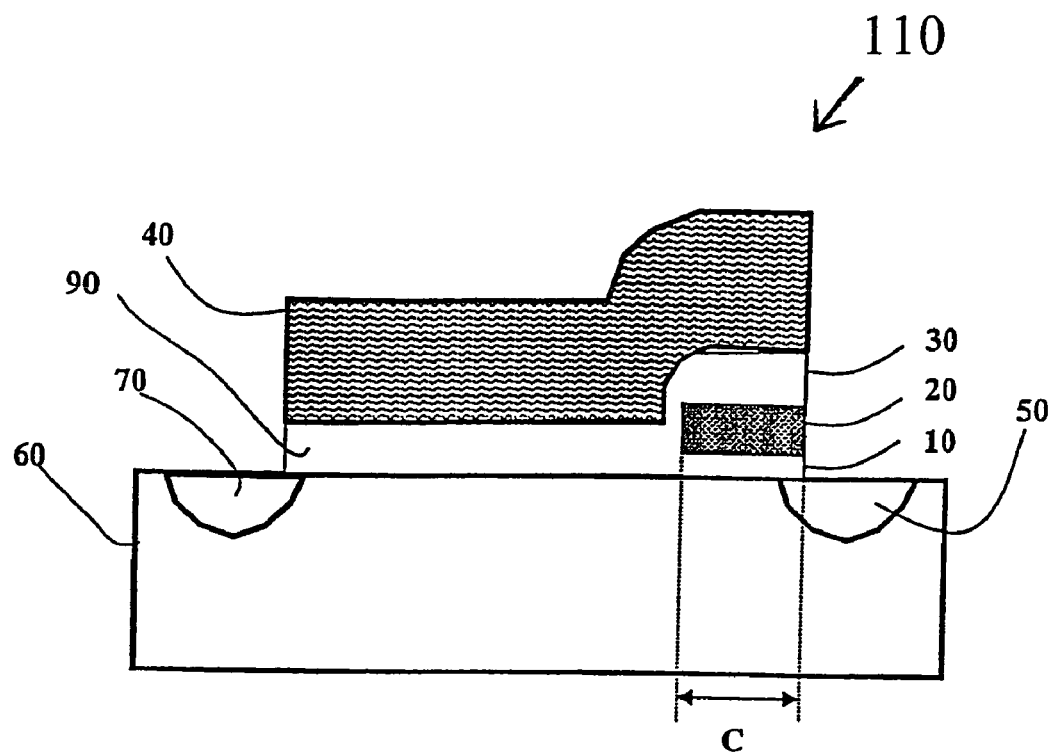
FIG. 5 is a cross-sectional view of a non-volatile memory cell according to an embodiment of the present invention.
Figure 6:
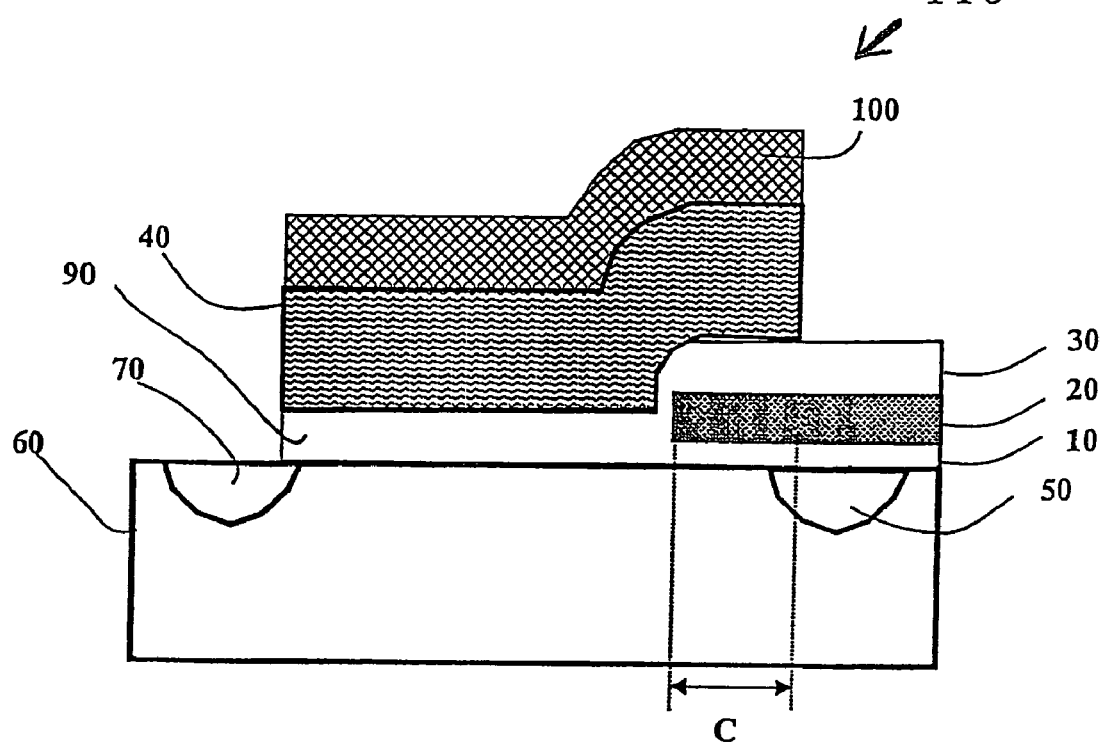
FIG. 6 is a cross-sectional view of a non-volatile memory cell according to another embodiment of the present invention.

FIG. 5 is a cross-sectional view of a non-volatile memory cell 110 having a SONOS structure, according to embodiments of the invention. The memory cell 110 includes, formed on a substrate 60, a tunneling layer 10, a charge trapping layer 20, a blocking layer 30, and a control gate electrode 40. Additionally formed on the substrate 60 is a gate insulating layer 90. Formed within the substrate 60, substantially below edges of the control gate 40 are a drain 50 and a source 70, which are made by doping the substrate appropriately. The functions of the drain 50 and source 70 can be interchanged by applying a biasing voltage, as discussed below. As shown in FIG. 5, the charge trapping layer 20 does not extend fully across the length of the memory cell 110, but only across a portion thereof. Additionally, as shown in FIG. 6, the memory cell 110 can also include a metal silicide layer 100 formed on the control gate 40. The metal in the metal silicide layer 100 could be, for example, Tungsten, Titanium, Tantalum, Molybdenum, or others. The metal silicide layer 100 is oftentimes used in this manner to reduce the resistance of a word line in a memory array, as the word lines are typically coupled to the control gates 40 of memory cells 110 making up the memory array.

The memory cell 110 can be written to, or programmed, read, and erased by applying different voltages to its control gate 40, its source 70, and its drain 50, as discussed below. Reading the memory cell 110 determines if the cell is in a programmed or an erased state. In general, programming the memory cell 110 means injecting hot electrons into trapping regions of the charge trapping layer 20, while erasing the memory cell means injecting holes into the trapping regions, thereby neutralizing the previously trapped electrons.

To write, or program the memory cell 110, voltages can be applied to the control gate 40 and the drain 50 while grounding the source 70 to cause electrons to be trapped in the trapping regions of the charge trapping layer 20. For example, 9V can be applied to the control gate 40, 6.5V applied to the drain 50, and 0V applied to the source 70. These voltages create a vertical and lateral electric field along the length of a channel region that extends from the source 70 to the drain 50. This electric field causes electrons to be drawn off the source 70 and begin accelerating toward the drain 50. As the electrons move along the length of the channel, they gain energy. Some of the electrons gain enough energy or become "hot" enough to jump over the potential barrier of the oxide layer 10 and enter the charge trapping layer 20 where they become trapped. The probability of this occurrence is greatest in the region of the channel near the drain 50, which is where the electrons have gained the most energy. Once the hot electrons are injected into the charge trapping layer 20, they become trapped in trapping regions in the layer, and remain stored therein.

To read the memory cell 110, voltages can be applied to the control gate 40 and to the source 70, while the drain 50 is grounded. Reading the memory cell 110 can either be in the same direction in which it was programmed ("forward read"), or can be read in a direction opposite to which it was programmed ("reverse read"), as is known in the art. Reading the memory cell 110 in the reverse direction generally allows the cell to be read with lower voltages applied to the cell because the same amount of charge stored in the charge trapping layer 20 is easier to detect in the reverse direction than in the forward direction. For example, to read the memory cell 110 in the reverse direction, 3V is applied to the control gate 40, 1V is applied to the source 70, and 0V is applied to the drain 50.

In general, the trapped electrons remain in the charge trapping layer 20 near the drain 50, and do not migrate across the charge trapping layer. Thus, when the memory cell 110 is programmed by trapping electrons in this layer, the threshold voltage of the cell rises. This is because an additional voltage must be applied to the control gate 40 to overcome the charge of the electrons that are trapped in the charge trapping layer 20, in order to invert the channel region of the memory cell 110. For example, the threshold voltage, which is typically 0.7–1.2 Volts when no electrons are trapped in the nitride layer 20, rises to approximately 4V in the portion of the channel under the charge trapping layer 20 in which electrons are trapped. The threshold voltage of the remainder of the channel of the memory cell 110 remains at, for example, approximately 1 V, even when the charge trapping layer 20 contains trapped electrons.

Because, as described above, when reading the memory cell 110 only approximately 3V is applied to the control gate 40, there is not enough voltage applied to the control gate 40 to overcome the increased threshold voltage (4V) when the charge trapping layer 20 is trapping electrons, yet there is enough voltage applied to the control gate 40 to overcome the threshold voltage (1V) when the charge trapping layer 20 is not storing electrons. Therefore, based on the ability of the memory cell 110 to have different threshold voltages, the contents of the memory cell can be read by applying the voltages to the control gate 40, the source 70 and the drain 50 as described above.

When the 3V signal is applied to the control gate 40, non-programmed memory cells 110 (i.e., those not having electrons trapped in their charge trapping layer 20) can conduct current between the source and the drain, while programmed memory cells (those having electrons stored in their charge trapping layer 20) cannot conduct current. By applying a potential difference of 1V between the source 70 (1V) and the drain 50 (0V), when the 3V is applied to the control gate 40, those memory cells 110 that can conduct current (the non-programmed memory cells) will so conduct, and those memory cells that cannot conduct current (the programmed memory cells) will not conduct.

Thus, the nonvolatile memory cell 110 can be turned ON or OFF depending on whether it is written (programmed) or not. Specifically speaking, if the memory cell 110 is in a programmed state, i.e., its charge trapping layer 20 has been injected with electrons, the threshold voltage of the memory cell is HIGH and, hence, when a 3V signal is applied to its control gate 40 the memory cell conducts no current and is in an OFF state. In contrast, if the charge trapping layer 20 is not injected with electrons, current flows between the drain 50 and source 70 and, hence, the nonvolatile memory cell 110 is turned ON. As a result, a datum "1" or "0" can be read from the memory cell.

To erase the memory cell 110 of FIG. 5, a set of voltages different than those used to program or read the memory cell are used. For example, a −9V signal can be applied to the control gate 40 while 6.5V is applied to the drain 50. The source 70 is allowed to float. As a result, the electrons previously retained in the nitride layer 20 are removed therefrom toward the drain, or the holes in the drain 50 are injected therefrom toward the charge trapping layer 20. Whatever the actual mechanism, the electrons previously stored in the charge trapping layer 20 are removed or neutralized by the injected holes, thus returning the memory cell 110 to its native, erased state.

Figure 7:
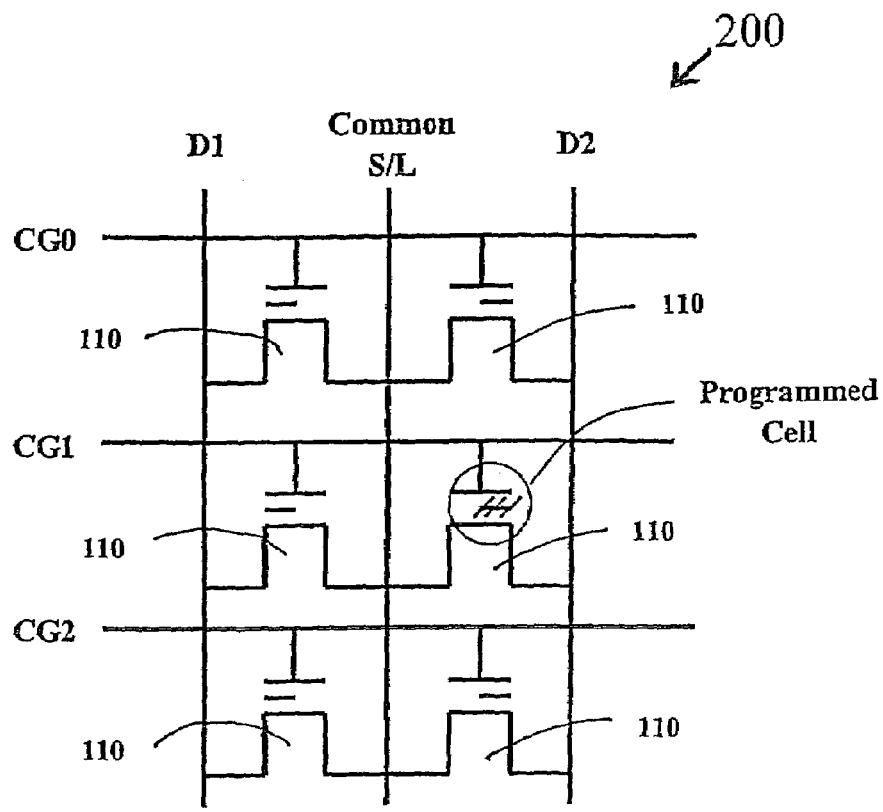
FIG. 7A is a schematic diagram of memory cells according to embodiments of the present invention in different various states of operation.
FIG. 7B is a chart indicating signals used to drive the memory cells shown in FIG. 7A.

FIG. 7A is a schematic diagram showing one example of how multiple memory cells 110 can be joined to form a memory array 200. The memory array 200 of FIG. 7A includes six memory cells 110, coupled in a NOR array configuration, with three word lines, CG0, CG1, CG2, which are each coupled to the control gate 40 of two memory cells, two bit lines D1 and D2, each of which is coupled to the drain 50 of three memory cells, and a common source line, which is coupled to the source 70 of all six memory cells. FIG. 7B is a chart showing how a particular cell of the memory array 200 can be programmed, erased, and read by applying appropriate voltages to the control lines CG1, SL, and D2, connected to the particular cell, which is on the right hand side in the middle of the array 200.

The charge trapping layer 20 of the memory cell 110 of FIGS. 5 and 6 differs from the charge trapping layer 12 of the memory cell 5 of FIGS. 1–4. Specifically, while the charge trapping layer 12 of the memory cell 5 extends across the entire length of the memory cell 5, the charge trapping layer 20 of the memory cell 110 extends across only a portion of the length of the memory cell 110.

Shown in FIGS. 5 and 6 is an overlap length "C" of the charge trapping layer 20, which indicates the length of the nitride layer 20 that is overlapped by the control gate 40 of the memory cell 110. It has been determined that program and erase operations of the memory cell 110 can be strongly affected by the overlap length C of the charge trapping layer and the control gate 40. The effects on cell performance due to the over lap length C are summarized in Table 1 and Table 2.

TABLE 1

The effect of charge trapping overlap length on programming speed

| Overlap length (C) | Program time [s] | | | | | | | |
|---|---|---|---|---|---|---|---|---|
| | Initial | 10 us | 30 us | 50 us | 70 us | 100 us | 500 us | 1 ms |
| Full length of gate [ΔVth] | 0 | 1.2 | 1.7 | 2.1 | 2.4 | 2.7 | 2.8 | 2.9 |
| One-half of gate length [ΔVth] | 0 | 2.4 | 3.0 | 3.3 | 3.4 | 3.7 | 4.7 | 4.9 |
| One-third of gate length [ΔVth] | 0 | 2.3 | 2.9 | 3.2 | 3.3 | 3.6 | 4.5 | 4.7 |
| One-quarter of gate length [ΔVth] | 0 | 2.1 | 2.8 | 3.0 | 3.2 | 3.4 | 4.2 | 4.4 |

TABLE 2

The effect of charge trapping overlap length on erasing speed

| Overlap length (C) | Erase time [s] | | | | | | | |
|---|---|---|---|---|---|---|---|---|
| | Initial | 10 us | 30 us | 50 us | 70 us | 100 us | 500 us | 1 ms |
| Full length of gate [ΔVth] | 0 | −1.2 | −1.2 | −1.3 | −1.3 | −1.4 | −1.4 | −1.4 |
| One-half of gate length [ΔVth] | 0 | −2.4 | −2.6 | −2.7 | −2.8 | −2.9 | −3.1 | −3.2 |
| One-third of gate length [ΔVth] | 0 | −2.5 | −2.9 | −3.1 | −3.2 | −3.2 | −3.3 | −3.4 |
| One-quarter of gate length [ΔVth] | 0 | −2.6 | −3.3 | −3.5 | −3.5 | −3.6 | −3.7 | −3.7 |

These tables show how much the threshold voltage (Vth) changes in the memory cell 110 for different periods of programming or erase time for memory cells 110 having different overlap lengths C, i.e., the length of the charge trapping layer 20 that is overlapped by the control gate 40. For example, Table 1 shows that programming a memory cell 110 having an overlap length C of one-third the length of the control gate 40 for a time period of 70 μs will increase the threshold voltage of the memory cell by 3.3 volts. Erasing the same memory cell for the same amount of time (Table 2) will reduce the threshold voltage by 3.2 volts.

As can be seen in Table 1, increasing the overlap length C of the charge trapping layer 20 increases the programming speed. For example, a memory cell 110 having an overlap C of one-quarter the gate length that is programmed for 50 μs can have its threshold raised 3.0 volts, while if the memory cell had an overlap C of one-half the gate length, the same change in threshold voltage can be accomplished in only 30 μs.

However, as shown in Table 2, increasing the overlap length C of the charge trapping layer retards the erase speed. For example, a memory cell 110 having an overlap C of one-third of the gate length that is erased for 50 μs can have its threshold voltage reduced by 3.1 volts, but if the memory cell had an overlap C of one-half the gate length, it would take 500 μs, or ten times as long to reduce the threshold voltage of the memory cell by the same amount.

Such a reduced erase capability worsens the endurance properties of the memory cell 110. As described above, in general, electrons are injected into the charge trapping layer 20 farther from drain 50 in the programming cycle than the holes are injected in the erase cycle. And therefore, those electrons that are trapped in the charge trapping layer 20 farthest away from the drain 50 cannot be completely erased by injecting holes in the nitride layer. This is especially true in longer charge trapping layers. It is believed that this is the reason that the regions between the electron injection in the programming phase and the hole injection in the erasing phase are not identical (Regions A-B in FIG. 4).

In embodiments of this invention, restricting the overlap length C provides a marked improvement in the erase speed and endurance of a SONOS cell. Accordingly, embodiments of the invention seek to control the overlap length of charge trapping layer, rather than simply controlling the length of the charge trapping layer 20 itself. Also, because the charge trapping layer 20 is a nonconductive layer, contacting the source 70 and drain 50 from a metallic wiring layer (not shown) is not problematic.

An additional benefit of not creating the charge trapping layer 20 across the entire memory cell 110 length is that, as is shown in FIGS. 5 and 6, the gate insulating layer 90 can be used in place of the ONO stack (the tunneling layer 10, the charge trapping layer 20, and the blocking layer 30). Accordingly, the gate insulating layer 90 has a lower effective oxide thickness (Tox) than the ONO stack, which further reduces the threshold voltage of the SONOS memory cell 110, compared to the conventional SONOS cell 5 of FIGS. 1–4. This lowered threshold has related advantages of 1) a higher programming speed and lower operation voltage because of the sufficient current supply in the program phase; and 2) a faster read speed due to the increased current in a cell in its erased state.

FIGS. 8–11 describe a fabrication method for the nonvolatile memory device 110, according to an embodiment of the present invention.

Figure 8:
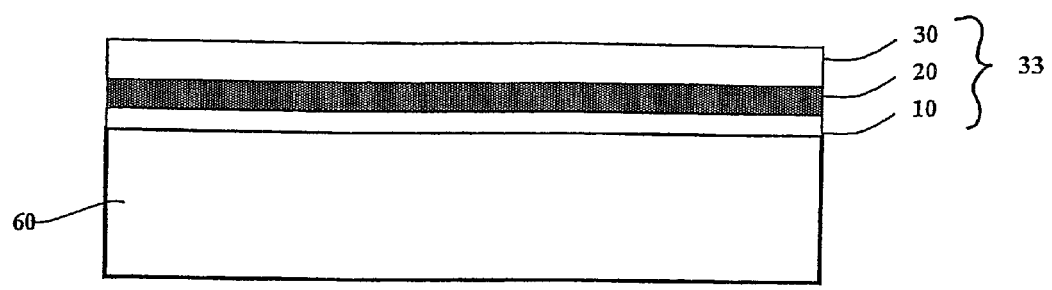
FIGS. 8 to 11 are cross-sectional views illustrating methods of fabricating a nonvolatile memory device of the present invention utilizing SONOS.

The process begins as illustrated in FIG. 8, with the formation of an ONO structure 33 on the surface of a substrate 60. The ONO layer 33 includes a tunneling layer 10, for example a silicon dioxide layer, overlying the surface of substrate 60, a charge trapping layer 20 overlying the tunneling layer 10, and a blocking layer 30, which can also be, for example, a silicon dioxide layer. In one embodiment, the tunneling layer 10 is formed by a thermal oxidation of the substrate 60. The oxidation can be performed in a nitrogen containing environment such that the tunneling layer 10 is an oxynitride layer. Following the oxidation process, the charge trapping layer 20 can be deposited by Chemical Vapor Deposition (CVD). After depositing the charge trapping layer 20 on the tunneling layer 10, the blocking layer 30 is formed, for example by using another CVD process. In a preferred embodiment, the tunneling layer 10 is thermally grown to a thickness of about 15–80 Å, the charge trapping layer 20 is preferably deposited to a thickness of around 40–80 Å, and the blocking layer 30 is preferably deposited to a thickness of about 40–120 Å.

Figure 9:
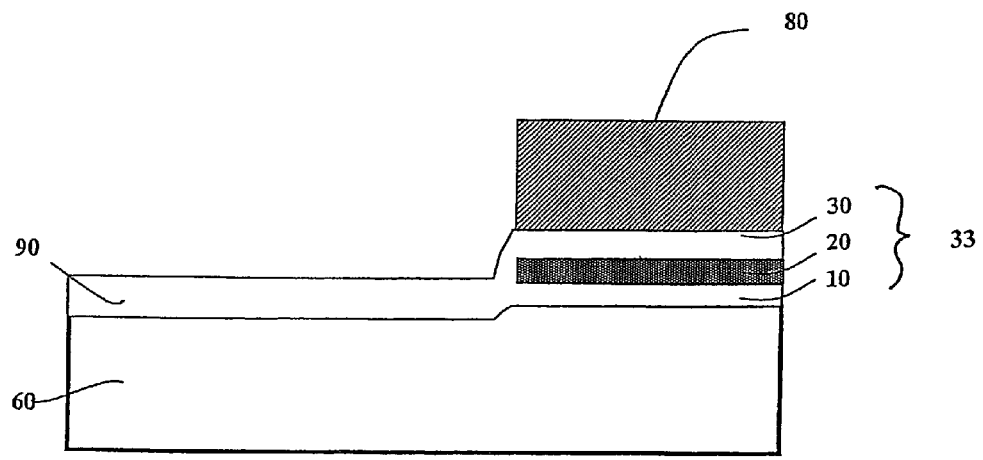

Next, a photoresist film 80 having a thickness of about 1 μm is applied to the substrate surface and patterned to enable a portion of the ONO structure 33 to be removed. Once the pattern is complete in the photoresist 80, the ONO structure 33 is etched with, for example, hydrofluoric acid to expose a portion of the silicon substrate 60 (FIG. 9).

Figure 10:
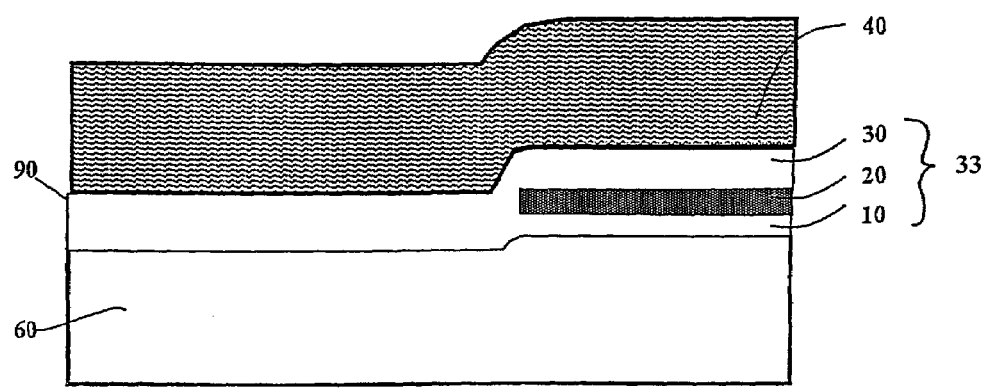

Subsequently, the surface of the exposed silicon substrate 60 is oxidized, for example by a heat treatment of between about 850 to 900° C. for about 60 minutes, to form a gate insulating layer 90 of silicon dioxide having a thickness of about 100–150 Å. A polycrystalline silicon, or polysilicon, layer to be used for a control gate electrode 40 is deposited to about 1500 Å thickness over the entire surface of the resulting structure by using, for example, a CVD technique (FIG. 10). In one embodiment, phosphine gas is mixed at a rate of about 10% by volume with a source gas for the CVD so that the resulting polysilicon layer can be doped with n-type impurity (Phosphorus), thereby giving the layer higher conductivity than an undoped polysilicon layer. Also, a metal silicidation process can be used on the gate electrode 40 to reduce a current resistance of a gate line.

Figure 11:
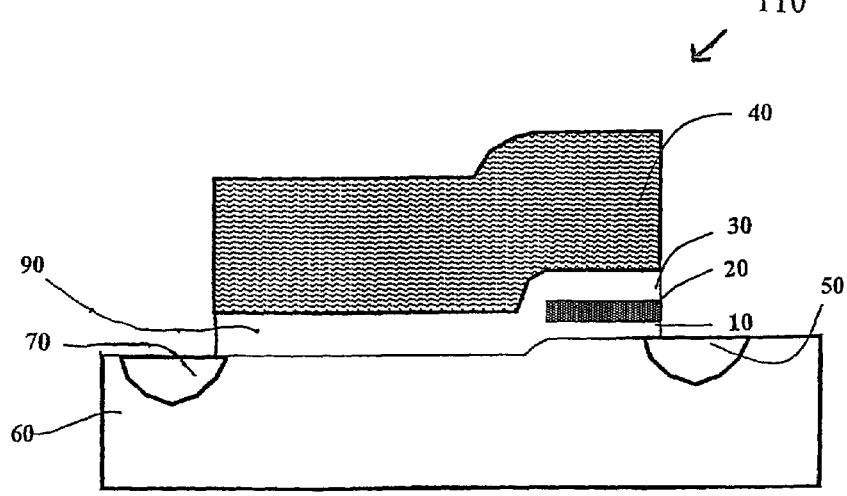

Next, the polysilicon layer 40 is etched, for example, by a Reactive Ion Etching (RIE) technique while masked with a photoresist film (not shown) to define the control gate electrode 40 (FIG. 11). The ONO structure 33 may also etched at the edge of the control gate electrode 40. Alternately, because the ONO structure 33 is a nonconductive layer, it does not have to be etched to have the same edge as the control gate electrode 40. Such a structure would be like that shown in FIG. 6, which, incidentally, also includes a metal silicide layer 100 on the control gate electrode 40, as described above.

Generally, the ONO structure 33 and gate insulating layer 90 will have different thicknesses. Having the gate insulating layer 90 be thinner than the ONO structure 33, as shown in FIG. 11, is efficient in that it lowers the operation voltage of memory device 110.

Next, doping ions, such as arsenic ions, are implanted with an acceleration energy of about 60 keV and a dose of about $5E15/cm^2$ to simultaneously form a n+ type source region 70 and an n+ type drain region 50. The source 70 and drain 50 are formed at the edges of the control gate 40, but within the substrate 60.

Figure 12:
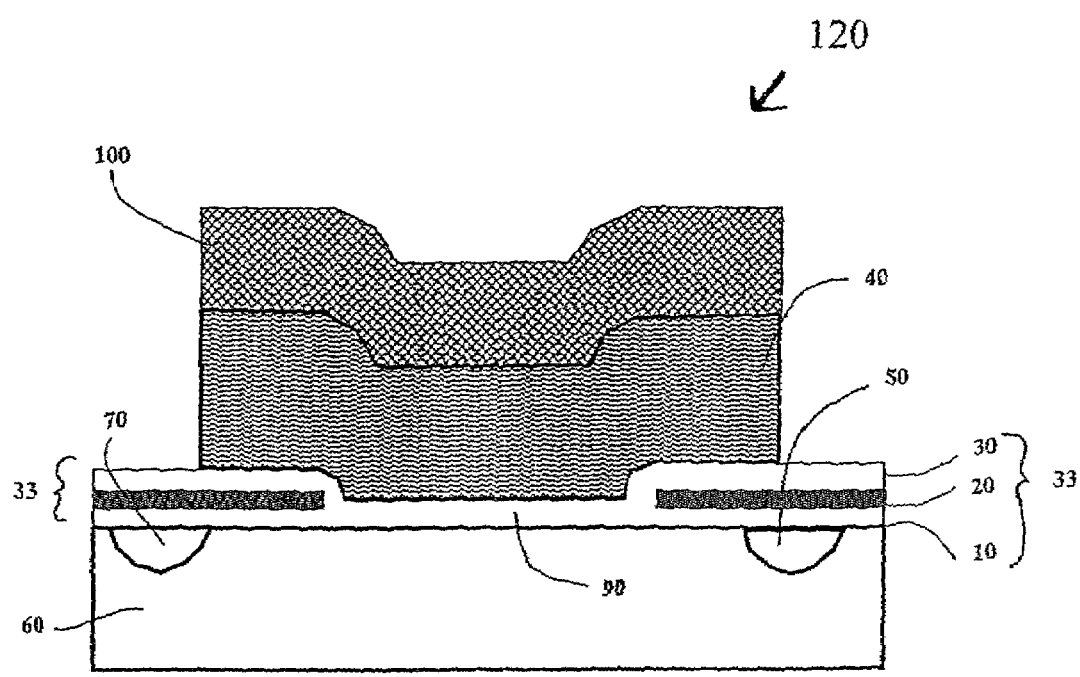
FIG. 12 is a cross-sectional view showing another embodiment of the present invention utilizing SONOS.

FIG. 12 is a sectional view of yet a different embodiment of the invention. Shown in that figure is a memory cell 120 where the charge trapping layer 20 extends from each side of the cell, i.e., near both the source 70 and the drain 50. The memory cell 120 is able to store two data bits in one cell, because electrons or holes can be trapped in each separate area of the charge trapping layer 20. Programming, reading and erasing the two-bit memory cell 120 of FIG. 12 is identical to the same functions as the single bit memory cell 110 described above, except that the programming, erasing and reading each bit is performed independent of the other. For instance, the electrons stored in the charge trapping layer 20 near the drain 50, termed the "right bit," can be read in the reverse direction by applying read voltages (from the chart in FIG. 7B) to the source 70 and the gate 40, and grounding the drain 50. Similarly, to read the left bit (the region of the nitride layer 20 near the source 70) in the reverse direction, read voltages are applied to the gate 40 and to the drain 50 while the source 70 is grounded.

FIGS. 13A–13G illustrate a fabrication method to create the general structure for the memory cell 120 of FIG. 12, according to embodiments of the invention.

Figure 13A:
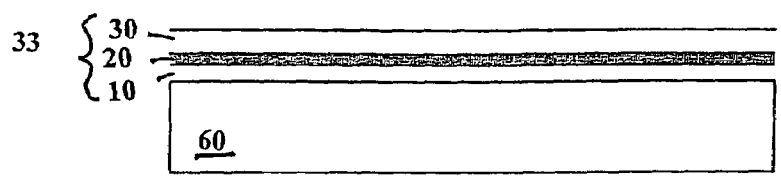
FIGS. 13A–13G are cross-sectional views illustrating methods of fabricating the nonvolatile memory device of FIG. 12.
Figure 13B:
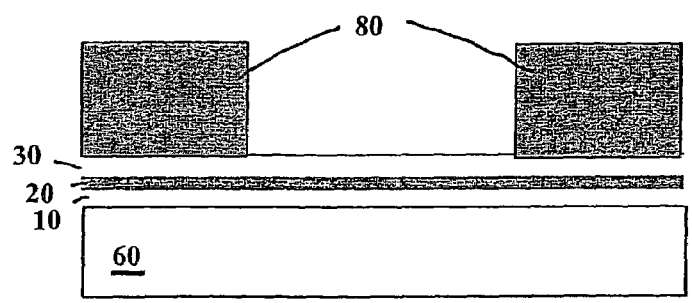
Figure 13C:
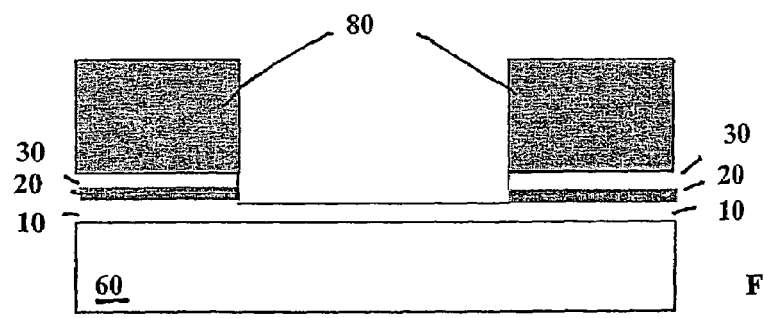
Figure 13D:
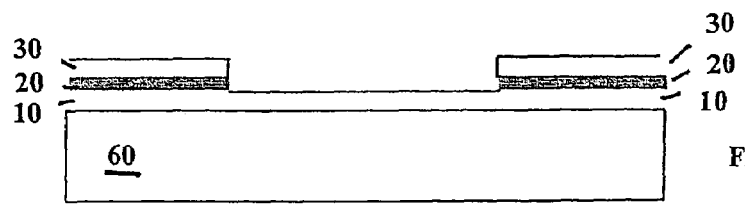

The process begins as illustrated in FIG. 13A, by creating the ONO structure 33 on the surface of a substrate 60, as above described with reference to FIG. 8. The ONO layer 33 includes the tunneling layer 10, the charge trapping layer 20, and the blocking layer 30. Next, as shown in FIG. 13B, the photoresist film 80 is applied and patterned to enable etching of the blocking layer 30 and the charge trapping layer 20 in the areas not covered by the photoresist 80. After the etching, the photoresist film 80 is stripped, as shown in FIG. 13D.

Figure 13E:
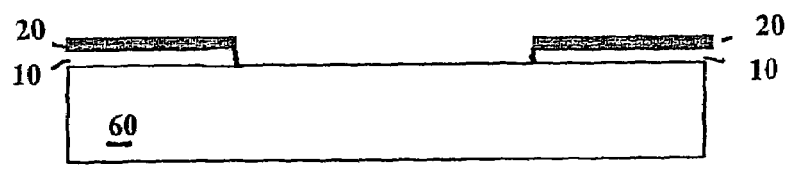

As shown in FIG. 13E, the blocking layer 30 that was exposed by stripping the photoresist film 80 is then etched, along with the portion of the tunneling layer 10 that is not covered by the charge trapping layer. Thus, at the state in the formation process, the tunneling layer 10 and charge trapping layer 20 exist, separated by an exposed portion of the substrate 60.

Figure 13F:
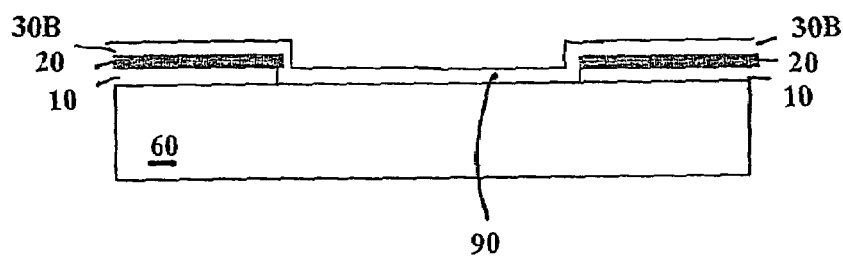
Figure 13G:
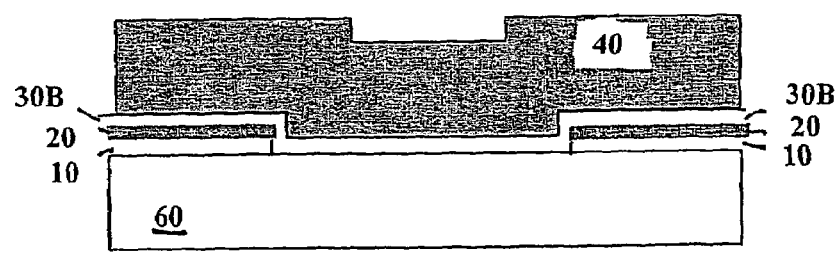

Next, as shown in FIG. 13F, an oxide layer is deposited on the substrate 60, such as by, for example, a chemical vapor deposition. The oxide covers all of the exposed surfaces, and creates a new blocking layer 30B, as well as the gate layer 90. Finally, as shown in FIG. 13G, a polysilicon layer is deposited to form the gate 40. To fully form the memory cell 120 of FIG. 12, all that is required is to form the source 70 and drain 50 regions, as well as the silicide layer 100.

Figure 14A:
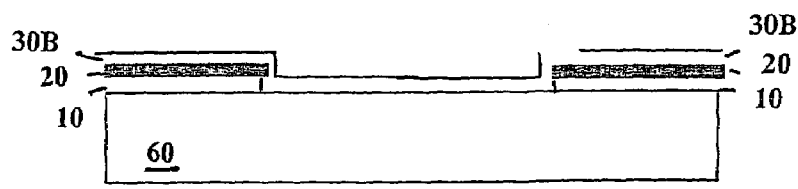
FIGS. 14A–14C are cross-sectional views illustrating additional ways to fabricate the nonvolatile memory device of FIG. 12.
Figure 14B:
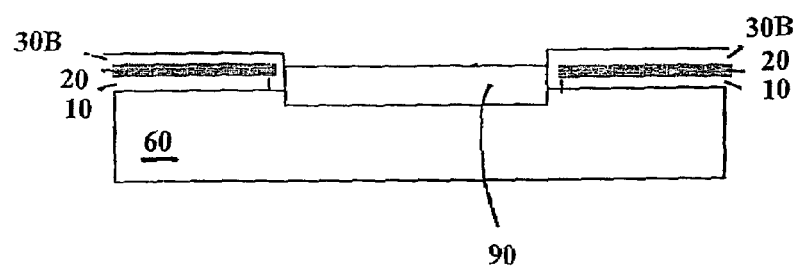
Figure 14C:
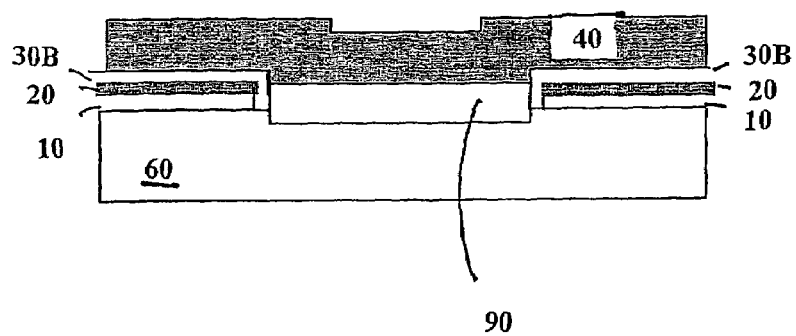

An alternate method to produce the memory device 120 is shown in FIGS. 14A–14C. FIG. 14A shows the substrate 60 in the same state it was in as shown in FIG. 13F, i.e., after the oxide deposition that formed the blocking layer 30B. Additionally, to increase the thickness of the gate layer 90, the deposited oxide can be thermally grown to create the gate layer 90 of the appropriate thickness. Finally, as shown in FIG. 14C, the structure is covered by a polysilicon layer to become the gate 40.

It should be mentioned that, the charge trapping layer can be formed of different types of materials without affecting the function of the memory cell. For instance, the charge trapping layer could have a dielectric base with islands of a charge trapping material formed therein. For example, a dielectric base of silicon dioxide could be used having buried or implanted islands of polysilicon or silicon nitride material. Or, the charge trapping layer could be an oxynitride layer, for example. Further examples include the trapping layer being formed of nitride dots or polysilicon dots. Any material sufficient to have the necessary charge trapping function can be used in embodiments of the invention.

Although example transistors having an N-type doping for source and drain regions have been described, nothing limits embodiments of the invention from using semiconductor materials from the opposite type. Additionally, some of the details of processes well known in the art have been omitted for brevity. For instance, voltages other than those described herein can be used to program, read, or erase the non-volatile memory cells.

Implementation of a memory cell and memory array device is straightforward to implement in light of the above disclosure. As always, implementation details are left to the system designer. The components used to create the cells in the array may be formed in any way, with any materials as long as they can accomplish the functions described above. The actual amount of overlap of the trapping layer by the control gate may be best determined empirically.

Thus, although particular embodiments for a non-volatile memory cell have been discussed, it is not intended that such specific references be considered as limitations upon the scope of this invention, but rather the scope is determined by the following claims and their equivalents.

What is claimed is:

1. A non-volatile memory cell comprising:
   a substrate having a source region formed therein, a drain region formed therein, and a channel area between the source region and the drain region;
   a trapping structure disposed over a portion of only a selected one of the source region or the drain region, the trapping structure including:
   a tunneling layer disposed on a first portion of the substrate, the first portion of the substrate extending from the selected region toward the channel area,
   a charge trapping layer formed on the tunneling layer, and
   a blocking layer formed on the charge trapping layer;
   a gate insulating layer disposed on a second portion of the substrate, the second portion of the substrate extending from the first portion of the substrate toward a non-selected region; and
   a gate disposed over the trapping structure and the gate insulating layer, the gate extending from the source region to the drain region.

2. The non-volatile memory cell according to claim 1 wherein the charge trapping layer is a non-conductive layer.

3. The non-volatile memory cell according to claim 1 wherein the gate insulating layer has a thickness that is thinner than a thickness of the trapping structure.

4. The non-volatile memory cell according to claim 1 wherein the trapping structure extends from the selected region less than one-half of a distance between the source region and the drain region.

5. The non-volatile memory cell according to claim 1 wherein the trapping structure extends from the selected region approximately one-fourth of a distance between the source region and the drain region.

6. The non-volatile memory cell according to claim 1 wherein the charge trapping layer comprises silicon nitride.

7. The non-volatile memory cell according to claim 1 wherein the charge trapping layer comprises nitride dots.

8. The non-volatile memory cell according to claim 1 wherein the charge trapping layer comprises polysilicon dots.

9. The non-volatile memory cell according to claim 1 wherein the charge trapping layer comprises an oxynitride layer.

10. The non-volatile memory cell according to claim 1 wherein the tunneling layer comprises an oxynitride layer.

11. The non-volatile memory cell according to claim 1 wherein the tunneling layer comprises a silicon oxide layer.

12. The non-volatile memory cell according to claim 1 wherein the blocking layer comprises a silicon oxide layer.

13. The non-volatile memory cell according to claim 1 wherein the gate insulating layer is formed of silicon dioxide.

14. The non-volatile memory cell according to claim 1, further comprising a silicide layer formed on the gate.

15. The non-volatile memory cell according to claim 1 wherein an edge of the gate is substantially aligned with an edge of the trapping structure.

16. The non-volatile memory cell according to claim 1 wherein the cell is structured to be erased by injecting holes in the charge trapping layer.

17. The non-volatile memory cell according to claim 1 wherein the cell is structured to be programmed in a first direction and read in a second direction.

18. The non-volatile memory cell according to claim 1 wherein a top surface of the substrate near an edge of the charge trapping layer has a step portion, the step portion disposed over the channel area.

19. A memory device, comprising:
a matrix of a plurality of memory cells formed in columns and rows, each memory cell including:
a substrate having a source region formed therein, a drain region formed therein, and a channel area extending between the source region and the drain region,
a trapping structure disposed over a first portion of the substrate, the first portion of the substrate extending from only a selected one of the source or drain region toward the channel area, the trapping structure including:
a tunneling layer disposed on the first portion of the substrate,
a charge trapping layer formed on the tunneling layer, and
a blocking layer formed on the charge trapping layer,
a gate insulating layer disposed on a second portion of the substrate, the second portion of the substrate extending from the first portion of the substrate toward a non-selected region, and
a gate disposed on the trapping structure and the gate insulating layer, the gate extending from the source region to the drain region;
a word line coupled to gates of one or more of the plurality of memory cells located in a same row;
a bit line coupled to the drain region of one or more of the plurality of memory cells located in a same column; and
a source line coupled to the source region of one or more of the plurality of memory cells located in a same column.

20. The memory device according to claim 19 wherein the gate insulating layer has a thickness that is thinner than a thickness of the trapping structure.

21. The memory device according to claim 19 wherein the trapping structure extends from the selected region less than one-half of a distance between the source region and the drain region.

22. The memory device according to claim 19 wherein the trapping structure extends from the selected region approximately one-fourth of a distance between the source region and the drain region.

23. The memory device according to claim 19 wherein the charge trapping layer comprises silicon nitride.

24. The memory device according to claim 19 wherein the charge trapping layer comprises nitride dots.

25. The memory device according to claim 19 wherein the charge trapping layer comprises polysilicon dots.

26. The memory device according to claim 19 wherein the charge trapping layer comprises an oxynitride layer.

27. The memory device according to claim 19 wherein the tunneling layer comprises an oxynitride layer.

28. The memory device according to claim 19 wherein the tunneling layer comprises silicon dioxide.

29. The memory device according to claim 19 wherein a top surface of the substrate near an edge of the charge trapping layer has a step portion, the step portion disposed over the channel area.

30. A non-volatile memory cell comprising:
a substrate having a source region formed therein, a drain region formed therein, and a channel area between the source region and the drain region;
a trapping structure disposed over a portion of only a selected one of the source region or the drain region, the trapping structure including:
a tunneling layer disposed on a first portion of the substrate, the first portion of the substrate extending from the selected region toward the channel area,
a charge trapping layer formed on the tunneling layer, and
a blocking layer formed on the charge trapping layer;
a gate insulating layer disposed on a second portion of the substrate, the second portion of the substrate extending from the first portion of the substrate toward a non-selected region; and
a gate disposed over the trapping structure and the gate insulating layer,
wherein the trapping structure extends from the selected region less than approximately ⅓ of the distance between the source region and the drain region.

31. The non-volatile memory cell according to claim 30 wherein the charge trapping layer is a non-conductive layer.

32. The non-volatile memory cell according to claim 30 wherein the gate insulating layer has a thickness that is thinner than a thickness of the trapping structure.

33. The non-volatile memory cell according to claim 30 wherein the charge trapping layer comprises nitride dots.

34. The non-volatile memory cell according to claim 30 wherein the charge trapping layer comprises polysilicon dots.

35. The non-volatile memory cell according to claim 30 wherein the charge trapping layer comprises an oxynitride layer.

36. The non-volatile memory cell according to claim 30 wherein an edge of the gate is substantially aligned with an edge of the trapping structure.

37. A memory device, comprising:
a substrate having a first region and a second region;
a trapping structure disposed over the first region, the trapping structure including:
a tunneling layer disposed on the first region,
a charge trapping layer formed on the tunneling layer, and
a blocking layer formed on the charge trapping layer;
a gate insulating layer disposed on the second region; and
a gate disposed on the trapping structure and also on the gate insulating layer,
wherein the substrate includes a step portion extending between the first region and the second region, the step portion disposed below the gate and adjacent an edge of the charge trapping layer.

38. The device of claim 37, wherein the gate has a step portion in substantial vertical alignment with the step portion of the substrate.

39. A memory device, comprising:
a substrate having a source region and a drain region formed therein, and a channel area extending between the source region and the drain region;
a trapping structure disposed over a first portion of the substrate, the first portion of the substrate extending from a selected one of the source or drain region toward the channel area, the trapping structure including:
a tunneling layer disposed on the first portion of the substrate,
a charge trapping layer formed on the tunneling layer, and a blocking layer formed on the charge trapping layer;
a gate insulating layer disposed on a second portion of the substrate, the second portion of the substrate extending from the first portion of the substrate toward a non-selected region; and
a gate disposed on the trapping structure and the gate insulating layer, the gate extending from the source region to the drain region,
wherein the substrate includes a step portion extending between the first portion and the second portion, the step portion disposed below the gate and near an edge of the charge trapping layer.

40. The device of claim 39, wherein the gate has a step portion in substantial vertical alignment with the step portion of the substrate.

41. The device of claim 39, wherein the step portion is located within the channel region.

* * * * *